United States Patent [19]
Marro et al.

[11] 4,314,201
[45] Feb. 2, 1982

[54] POWER MEASURING APPARATUS

[75] Inventors: Michael Marro, Plainview; John Monin, Woodhaven, both of N.Y.

[73] Assignee: Dynamic Instrument Corporation, Hauppague, N.Y.

[21] Appl. No.: 139,995

[22] Filed: Apr. 14, 1980

[51] Int. Cl.³ .................. G01R 15/02; G01R 15/08; G01R 19/22
[52] U.S. Cl. .................. 324/127; 324/115; 324/119
[58] Field of Search ............ 324/127, 119, 115, 116, 324/103 R, 157, 113; 364/464, 483

[56] References Cited
U.S. PATENT DOCUMENTS
4,120,031  10/1978  Kincheloe et al. ............ 364/483

OTHER PUBLICATIONS
"Power Meter"; Popular Science; Mar. 1976; p. 152.

*Primary Examiner*—Ernest F. Karlsen
*Attorney, Agent, or Firm*—Eugene E. Geoffrey, Jr.

[57] ABSTRACT

Power measuring apparatus for electric appliances including interconnected male and female connectors for attachment to a source of power and to an appliance to be measured, a transformer having a primary winding in series with one of the conductors interconnecting the connectors, a potentiometer having a resistance element connected with the secondary winding on said transformer and a movable contactor, and an indicator connected between the contactor and one end of the resistance element, the potentiometer being calibrated in terms of cost per kilowatt-hour and the indicator being calibrated in terms of cost per hour.

4 Claims, 1 Drawing Figure

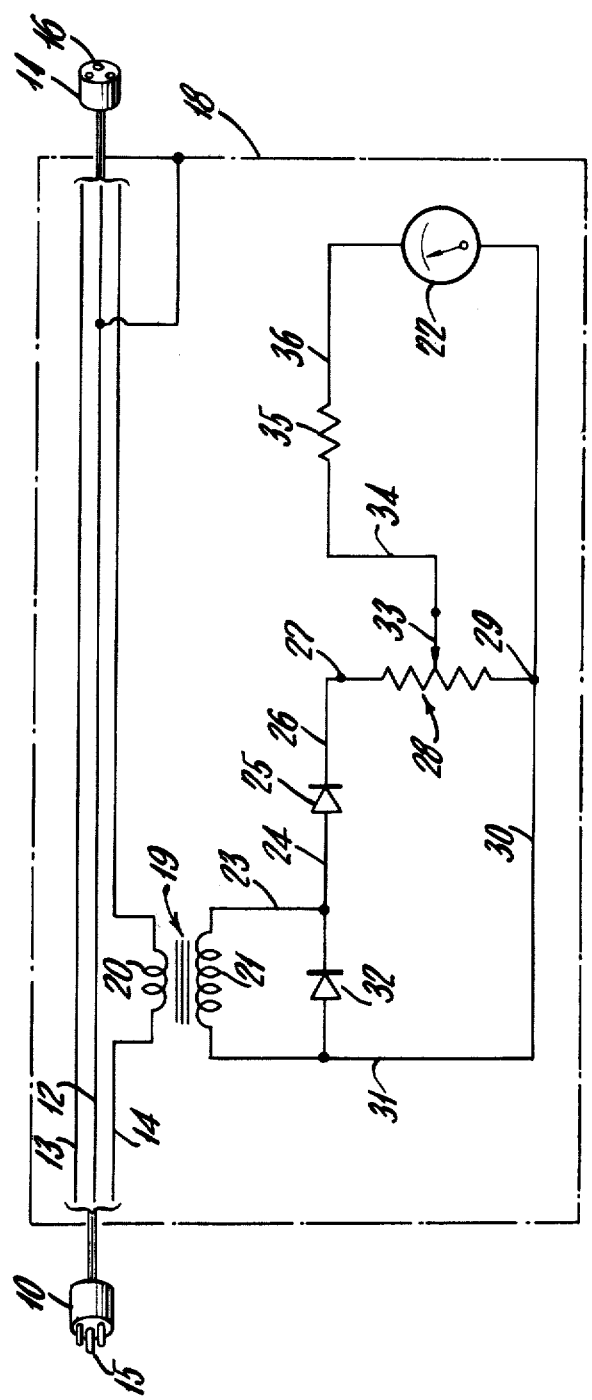

POWER MEASURING APPARATUS

This invention relates to power measuring apparatus and more specifically to novel and improved apparatus which greatly facilitates a measurement of the power utilized by an electric appliance and wherein the indication may be made directly in terms of cost of operation per hour.

Known apparatus for the measurement of current in a power supplying cable requires the exposure of a single conductor to permit it to be encircled by a transformer core which also carries a winding. With a suitable indicating means connected to the winding, the encirclement of a conductor by the core of the transformer provides in effect a single turn primary which will induce a voltage into the secondary and this voltage in turn is measured by suitable indicating means in terms of current. Such apparatus however is useful only in instances where a single conductor can be made available and therefore would not be readily useful for determining current comsumption of small electric appliances such as heaters, kitchen equipment and other similar devices used about the home or office. Furthermore, a current indication does not provide an indication useful for the determination of the cost of operation of such an appliance.

This invention has as one of its objects the provision of novel and improved apparatus which may be readily interconnected with any type of appliance and provide a direct indication of the cost of operation of the appliance in terms of cost per hour.

Another object of the invention resides in apparatus embodying a novel and improved circuit for measuring the cost of power utilized by an electrical appliance which may be readily interconnected with the electrical appliance to measure the power consumed by that appliance and at the same time imposing little if any voltage loss. In this way, an accurate indication is provided of the cost of operation of the appliance.

Still another object of the invention resides in the provision of a novel and improved circuit for measuring the power consumed by an electric appliance which provides a substantially stable indication of the cost per hour of power consumed and which is characterized by its simplicity and reliability.

The apparatus in accordance with the invention includes a male connector for insertion in a suitable electric receptacle and a female connector for attachment of the appliance. The connectors are interconnected and the primary of a transformer is inserted in series with one of the connections. The secondary of the transformer is fed through a rectifier to a resistive load. The load is in the form of a potentiometer with the movable contact being connected through a resistor to one side of an indicating meter. The other side of the meter is returned to one of the end contacts on the potentiometer. With this arrangement, current flowing from the male connector to the female connector will be recorded by the meter and the potentiometer may be adjusted to provide a meter indication in terms of cost per hour.

The above and other objects of the invention will become more apparent from the following description and accompanying drawing showing one embodiment of a circuit in accordance with the invention.

Referring now to the drawing, the male and female connectors are denoted by the numerals 10 and 11 respectively which are interconnected by conductors 12, 13 and 14. The conductor 12 is a ground conductor for carrying a ground from the prong 15 of the male connector 10 to the female contactor 16 of the female conductor 11. The conductor 12 is also connected through a conductor 17 to the housing for the apparatus illustrated diagramatically by the dotted outline 18. If desired, the female connector 11 may be fixedly mounted to a wall of the housing 18 and similarly the male connector 10 may also be secured to another wall of the housing 18 so that when the male connector is engaged with an electric outlet, the electric outlet will provide complete support for the entire apparatus.

The lead 13 is generally referred to as the neutral lead while the lead 14 is generally referred to as the hot lead. In the instant embodiment of the invention, a transformer 19 is provided with a primary 20 connected in series with the hot lead 14 and a secondary which will produce a voltage proportional to the current flowing through the primary. The primary of the transformer consists of only several turns of a relatively heavy wire sufficient to carry the current required by the largest appliance for which the apparatus may be designed. Through the utilization of a fairly small number of turns on the primary, negligible impedance will be inserted in series with the conductor 14 so that substantially the entire voltage impressed on the conductors 13 and 14 by the connector 10 will appear at the female connector 11. The secondary 21 of the transformer has a relatively large number of turns in order to provide adequate voltage for operation of the meter 22 or other suitable indicating means.

One side of the secondary 21 is connected through leads 23 and 24 to a diode 25. The output of the diode 25 is connected through a lead 26 to one end terminal 27 of a potentiometer 28. The other end terminal 29 of the potentiometer 28 is connected through leads 30 and 31 to the other side of the transformer secondary 21. A diode 32 is connected between the leads 23 and 31 to place a load on the secondary 21 during the portion of the alternating current cycle when the diode 25 is not conducting. Because the secondary 21 is of relatively high impedance, the transformer is substantially uniformly loaded during both portions of the alternating current cycle with the result that a relatively uniform indication on the meter 22 is obtained.

The moving contactor 33 is connected via the lead 34, optional series resistor 35 and lead 36 to one side of the meter 22. The other side of the meter 22 is connected to the lead 30.

As pointed out above, the indicator 22 is calibrated in terms of cost of power per hour. In as much as the electrical rates vary, the potentiometer 28 is calibrated in terms of unit cost per kilowatt-hour, as for instance from one cent to five or ten cents per kilowatt-hour. In this way, the user need merely set the potentiometer 28 to read the cost per kilowatt-hour and then upon inserting the apparatus in series with an electric appliance by plugging the appliance into the female connector 11 and plugging the male connector 10 into a source of energy, the meter will provide a direct indication of the cost per hour of operation. For instance, if the appliance draws 1,000 watts of electrical energy and the cost per kilowatt-hour is five cents, the meter will read five cents to show that that is the actual cost for use of the appliance for each hour. If the appliance draw 1,500 watts, then the meter will read seven and one-half cents.

It is evident that the housing 18 for the apparatus as described may take any of a variety of forms such as the form previously described or in the alternative the male and female connectors 10 and 11 may be carried by cables which in turn extend through the housing walls. The meter 22 may be an analog meter or may be arranged to have a digital readout in which case the meter would include an analog to digital convertor or in the alternative such a covertor may be mounted within the housing for connection to the meter.

While only one embodiment of the invention has been illustrated and described, it is evident that alterations, changes and modifications may be made without departing from the true scope and spirit thereof.

What is claimed is:

1. Alternating current power measuring apparatus for electric appliances comprising a male connector for engagement with a source of electric power, a female connector for attachment of an appliance to be energized, conductors interconnecting said female connector with said male connector, a transformer having a low impedance primary connected in series with one of said conductors and a higher impedance secondary, a potentiometer having a resistance element and a movable contactor electrically contacting said resistance element, means connecting said secondary to said resistance element to develop a voltage across said element proportional to the current flowing through said primary and a voltage indicator connected between said movable contactor and one side of said resistance element for indicating current flowing through the primary of said transformer, said potentiometer being calibrated in terms of cost per kilowatt-hour and said meter being calibrated in terms of cost of operation of said appliance per hour of operation.

2. Alternating current power measuring apparatus according to claim 1 wherein the last said connecting means comprises a rectifier for producing a DC voltage across said resistance element and said voltage indicator is responsive to said DC voltage.

3. Alternating current power measuring apparatus according to claim 2 wherein said rectifier is a diode connected in series with said transformer secondary.

4. Alternating current power measuring apparatus according to claim 3 including a second diode connected across said secondary winding and polarized to be non-conducting when the first said diode is conducting and conducting when the first said diode is non-conducting.

* * * * *